(12) United States Patent
Fisch

(10) Patent No.: US 6,661,695 B2
(45) Date of Patent: Dec. 9, 2003

(54) CAPACITANCE SENSING TECHNIQUE FOR FERROELECTRIC RANDOM ACCESS MEMORY ARRAYS

(75) Inventor: David Fisch, Black Forest, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 10/136,477

(22) Filed: May 1, 2002

(65) Prior Publication Data

US 2003/0206431 A1 Nov. 6, 2003

(51) Int. Cl.$^7$ .............................................. G11C 11/22
(52) U.S. Cl. .............. 365/145; 365/189.09; 365/230.06
(58) Field of Search ................................. 365/145, 149, 365/203, 189.09, 205, 207, 208, 210, 230.06

(56) References Cited

U.S. PATENT DOCUMENTS

| | | |
|---|---|---|
| 4,888,733 A | 12/1989 | Mobley |
| 4,914,627 A | 4/1990 | Eaton, Jr. et al. |
| 5,615,144 A | 3/1997 | Kimura et al. |
| 5,844,832 A * | 12/1998 | Kim ........................... 365/145 |
| 6,023,436 A * | 2/2000 | Han ........................... 365/203 |
| 6,091,623 A * | 7/2000 | Kang .......................... 365/145 |
| 6,285,575 B1 | 9/2001 | Miwa |

OTHER PUBLICATIONS

Miwa, Tohru; Yamada, Junichi; Koike, Hiroki; Toyoshima, Hideo; Amanuma, Kazushi; Kobayashi, Sota; Tatsumi, Toru; Maejima, Yukihiko; Hada, Hiromitsu; and Kunio, Takamitsu; NV–SRAM: A Nonvolatile SRAM with Backup Ferroelectric Capacitors, IEEE Journal of Solid State Circuits, vol. 36, No. 3, Mar. 2001, pp. 522–527.

* cited by examiner

Primary Examiner—Hoai Ho
Assistant Examiner—Gene N. Auduong
(74) Attorney, Agent, or Firm—Hogan & Hartson, LLP

(57) ABSTRACT

A capacitance sensing technique for ferroelectric random access, memory devices and arrays which enables fast sensing operations to be performed allowing for low latency "read" operations and thereby providing overall system performance advantages. Through the use of the technique of the disclosed, concurrent polling and reading of data may be achieved prior to pulsing (or driving) the plate line. This then allows the memory "restore" function to be hidden behind the "read" data stream at the memory device output pins. In accordance with the technique of the present invention, the sensing may begin prior to pulsing the plate line and it is the sensing process itself which interrogates the memory and concurrently prepares the data for the outputs. In this manner, it is the pulsing of the plate line after the data is sensed that performs the "restore" and this operation is not a portion of the "read" access time critical path.

9 Claims, 2 Drawing Sheets

CAPACITANCE SENSING TECHNIQUE FOR FERROELECTRIC RANDOM ACCESS MEMORY ARRAYS

BACKGROUND OF THE INVENTION

The present invention relates, in general, to the field of non-volatile, integrated circuit ("IC") memory devices and those ICs incorporating non-volatile memory arrays. More particularly, the present invention relates to a capacitance sensing technique for ferroelectric random access memory devices and arrays.

Ferroelectric memory devices, such as the FRAM® family of solid state, random access memory ("RAM") integrated circuits ("ICs") available from Ramtron International Corporation, Colorado Springs, Colo. provide non-volatile data storage through the use of a ferroelectric dielectric material which may be polarized in one direction or another in order to store a binary value. The ferroelectric effect allows for the retention of a stable polarization in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

A hysteresis curve, wherein the abscissa and ordinate represent the applied voltage and resulting polarization states respectively, may be plotted to represent the response of the polarization of a ferroelectric capacitor to the applied voltage. A more complete description of this characteristic hysteresis curve is disclosed, for example, in U.S. Pat. Nos. 4,914,627 and 4,888,733 assigned to the assignee of the present invention, the disclosures of which are herein specifically incorporated by this reference.

Data stored in a ferroelectric memory cell is "read" by applying an electric field to the cell capacitor. If the field is applied in a direction to switch the internal dipoles, more charge will be moved than if the dipoles are not reversed. As a result, sense amplifiers can measure the charge applied to the cell bit lines and produce either a logic "1" or "0" at the IC output pins. In a conventional two transistor/two capacitor ("2T/2C") ferroelectric memory cell, a pair of two data storage elements are utilized, each polarized in opposite directions. To "read" the state of a 2T/2C memory cell, the elements are polarized in opposite directions and the sense amplifiers measure the difference between the amount of charge transferred from the cells to a pair of complementary bit lines. In either case, since a "read" to a ferroelectric memory is a destructive operation, the correct data is then restored to the cell during a precharge operation.

In a simple "write" operation, an electric field is applied to the cell capacitor to polarize it to the desired state. For a 2T/2C cell, a field in the opposite direction is used to polarize the reference capacitor.

One conventional technique for reading data from a ferroelectric memory device is shown in U.S. Pat. No. 6,285,575 issued Sep. 4, 2001 to Miwa for: "Shadow RAM Cell and Non-Volatile Memory Device Employing Ferroelectric Capacitor and Control Method Therefor" which describes a device wherein ferroelectric capacitors are "one for one" coupled in with an SRAM cell and are only used when the shadow RAM device is "powered up" in a six transistor ("6T") shadow RAM application. See also, Miwa et al., "NV-SRAM: A Nonvolatile SRAM with Backup Ferroelectric Capacitors", IEEE Journal of Solid-State Circuits Vol. 36, No. 3, March 2001 at pp. 522–527. A further representative description of a ferroelectric memory "read" operation is described in U.S. Pat. No. 5,615,144 issued Mar. 25, 1997 for: "Non-Volatile Ferroelectric Memory Device with Leakage Preventing Function". Each of these publications describes a relatively slow conventional sensing operation which does not serve to decrease "read" operation latency.

SUMMARY OF THE INVENTION

The capacitance sensing technique for ferroelectric random access memory devices and arrays of the present invention, as disclosed herein, advantageously enables fast sensing operations to be performed as opposed to that of conventional techniques in which only much slower sensing can be effectuated. By enabling this faster sensing, the technique disclosed herein allows for low latency "read" operations thereby providing overall system performance advantages.

Through the use of the technique of the present invention, concurrent polling and reading of data may be achieved prior to pulsing (or driving) the plate line. This then allows the memory "restore" function to be hidden behind the "read" data stream at the memory device output pins. In contrast, with conventional memory device operation it is the plate line driver (or pulse) that interrogates the memory, generates a voltage and then allows sensing to both restore the data and prepare the data for the outputs. As disclosed herein, the sensing may, in accordance with the present invention, begin prior to pulsing the plate line and it is the sensing process itself which interrogates the memory and concurrently prepares the data for the outputs. In this manner, it is the pulsing of the plate line after the data is sensed that performs the "restore" and this operation is not a portion of the "read" access time critical path.

Through the technique of the present invention, lower capacitance bit lines may also be employed. This is a distinct advantage over those which are employed in conventional memory devices where the bit line capacitance must be large relative to the capacitance of the ferroelectric capacitors in order that a voltage greater than the ferroelectric coercive voltage is placed across the ferroelectric capacitor during the "read" interrogation. In conventional devices, the process of driving the plate line prior to the sensing operation creates a capacitor divider between the ferroelectric capacitor and the bit line. These relatively heavy bit lines consume power during the "sense" and "restore" operations, add to "read" and "restore" latency and reduce the signal differential into the sense amplifiers. By way of comparison, the technique of the present invention effectively grounds the plate line during the sense operation, and thus, one hundred percent of the voltage applied occurs across the ferroelectric capacitor thereby removing all prior limitations on the bit line capacitance. Consequently, significant benefits with respect to device power consumption and the latencies of the "read", "write" and "restore" operations are achieved.

Still further, the technique of the present invention allows for improved low voltage device operation. As technologies scale to ever smaller device geometries, the operating power supply voltage levels are also concomitantly reduced, often by a greater factor than the coercive voltage of the ferroelectric capacitor is reduced. When this occurs, low voltage "reads' of the ferroelectric device can be compromised, requiring internally generated power supplies which, in turn, add to chip size, complexity and power requirements. Inasmuch as the technique of the present invention does not divide the "read" voltage down, it provides an inherent advantage in low voltage operations over that of conventional devices and techniques.

Particularly disclosed herein is a sensing technique for an integrated circuit device comprising a memory array which includes a plurality of ferroelectric memory cells coupled to complementary bit lines. The technique comprises coupling the complementary bit lines together to a reference voltage level and enabling a word line coupled to at least a portion of the ferroelectric memory cells and coupling the complementary bit lines to a sense amplifier. The complementary bit lines are then uncoupled from each other and the reference voltage level and a first enable node of the sense amplifier is enabled. Data representative of the contents of selected ones of the ferroelectric memory cells is then provided at an output of the device.

Also particularly disclosed herein is an integrated circuit device comprising a memory array including a plurality of ferroelectric memory cells having a plate line and word line inputs thereto. The ferroelectric memory cells are coupled to first and second complementary bit lines and selectively couplable to first and second input nodes of a sense amplifier. The sense amplifier comprises first and second cross-coupled inverters with the input of the first inverter being coupled to the first input node and an output node of the second inverter and the input of the second inverter being coupled to the second input node and an output node of the first inverter. Optional first and second isolation transistors respectively couple the first and second complementary bit lines to the first and second input nodes in response to an isolation signal. The sense amplifier further comprises first and second enable nodes for the first and second cross-coupled inverters with the first enable node being selectively couplable to a supply voltage source through a first enable node transistor in response to a first latch enable signal and the second enable node being selectively couplable to a reference voltage level through a second enable node transistor in response to a second latch enable signal. An equilibration circuit is provided for selectively coupling the first and second input nodes together to the reference voltage level in response to an equilibration signal.

The present invention can be implemented with or without isolation transistors and depending on the precharge condition, with one or two sense amplifier enable nodes. For example, if the bit lines are precharged low, the lower enable transistor can be eliminated and the N-channel transistors in the sense amplifier inverters can be hard wired to ground. Conversely, if the bit lines are precharged high, the upper enable transistor can be eliminated. Further, the enable transistors can be local or shared among many sense amplifiers.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
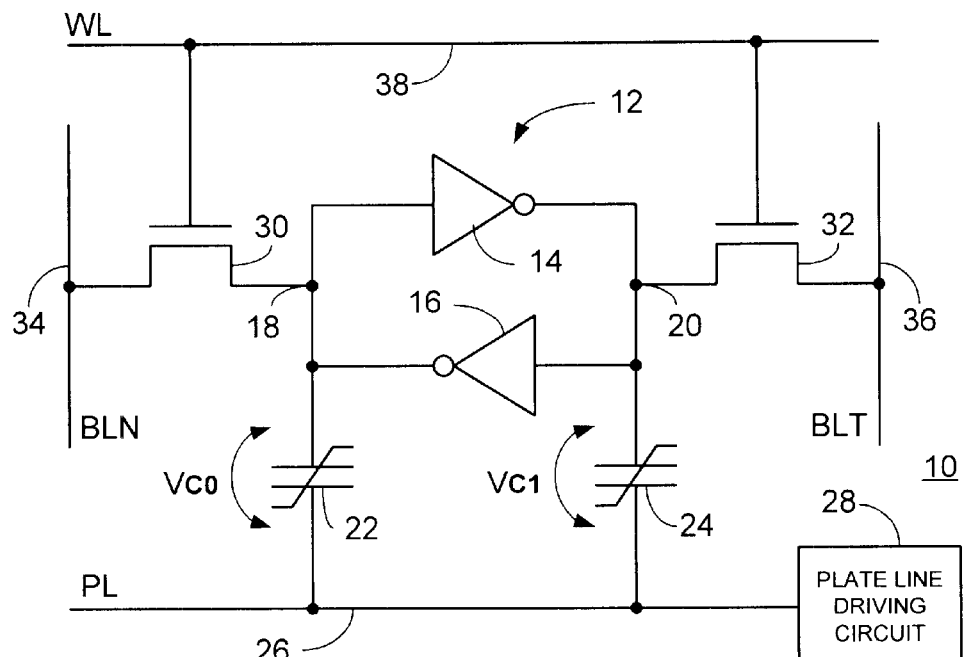
FIG. 1 is a schematic illustration of a portion of a prior shadow RAM cell and non-volatile memory device in accordance with U.S. Pat. No. 6,285,575 illustrating a flip-flop comprising a pair of cross-coupled inverters and a pair of ferroelectric capacitors.

With reference now to FIG. 1, a schematic illustration of a portion of a prior shadow RAM cell and non-volatile memory device 10 in accordance with U.S. Pat. No. 6,285,575 is shown. The memory device 10 incorporates a flip-flop 12 comprising a pair of cross-coupled inverters 14 and 16 defining nodes 18 and 20 as illustrated. A first ferroelectric capacitor 22 couples node 18 to a plate line ("PL") 26 while a complementary ferroelectric capacitor 24 couples node 20 to the plate line 26. The plate line 26 is driven by a plate line driving circuit 28.

A first N-channel transistor 30 couples the node 18 to a first bit line ("BLN") 34 while a second N-channel transistor 32 couples the node 20 to the complementary bit line ("BLT") 36. The gate terminals of transistors 30 and 32 are coupled to a common word line ("WL") 38 as shown. A more complete description of the memory device 10 and its functional operation is given in the aforementioned U.S. Pat. No. 6,285,575.

Figure 2:
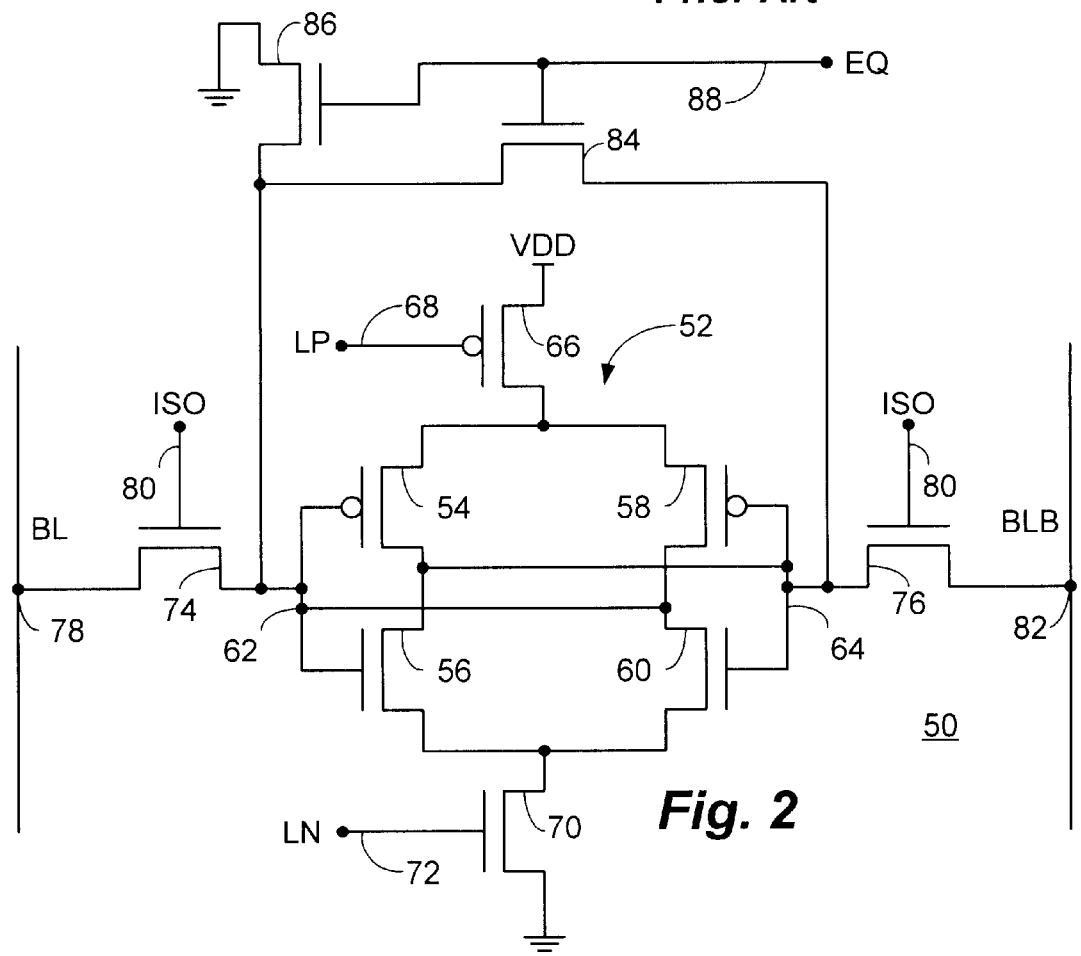
FIG. 2 is a schematic illustration of an exemplary sense amplifier for implementation of the capacitance sensing technique of the present invention.

With reference additionally now to FIG. 2, a schematic illustration of an exemplary sense amplifier 50 is shown for possible implementation of the capacitance sensing technique of the present invention. The sense amplifier 50 comprises a latch 52 itself comprising a pair of cross-coupled complementary metal oxide semiconductor ("CMOS") inverters. A first inverter comprises series connected P-channel transistor 54 and N-channel transistor 56 while the second inverter comprises series connected P-channel transistor 58 and N-channel transistor 60. The common connected gate terminals of transistors 54, 56 are coupled to a circuit node 62 while the common connected gate terminals of transistors 58, 60 are coupled to circuit node 64. The output of the second inverter is coupled to node 62 while the output of the first inverter is coupled to node 64.

Transistors 54 and 58 are selectively coupled to a supply voltage source ("VDD") through the activation of P-channel transistor 66 in response to a latch enable P-channel ("LP") signal on its gate terminal 68. In like manner, transistors 56 and 60 are selectively coupled to a reference voltage line ("VSS" or circuit ground) through the activation of N-channel transistor 70 in response to a latch enable N-channel ("LN") signal on its gate terminal 72. An additional N-channel transistor 74 couples node 62 to a first bit line ("BL") 74 while another N-channel transistor 76 couples node 64 to a complementary bit line ("BLB" bit line bar) 82. An isolation signal ("ISO") applied to the gate terminals of transistors 74, 76 serves to selectively couple or isolate the bit lines 78, 82 from the latch 52.

A further N-channel transistor 84 is coupled across the nodes 62 and 64 while N-channel transistor 86 is coupled between circuit ground an node 62. An equalization ("EQ") signal on line 88 applied to the gate terminals of transistors 84 and 86 serves to couple node 62 to circuit ground while coupling node 64 to node 62. Thus, both nodes 62 and 64 are equalized at a reference voltage level of VSS.

The sense amplifier 50 may be used, for example, with a conventional two transistor/two capacitor ("2T/2C")

memory cell configuration although it should be noted that the principles of the present invention are likewise applicable to one transistor/one capacitor ("1T/1C") memory cells as well as any memory cell configurations such as 2T/1C or more complicated cells having any possible number of transistors and capacitor combinations (e.g. "12T/4C" and the like). In a 1T/1C memory cell, for example, the cell structure is similar to that of a standard DRAM cell utilizing only a single pass transistor coupled to a single ferroelectric capacitor with the distinction of a third active line at the capacitor plate. Instead of a differential cell structure used in a 2T/2C configuration, a single bit line is coupled to one terminal of the transistor and the word line is coupled to the gate terminal. When reading the contents of a 1T/1C cell, the capacitor is polarized and the charge transferred is compared to a reference cell or other fixed capacitance level and the result of this comparison determines whether a logic level "1" or "0" was stored in the cell.

Figure 3:
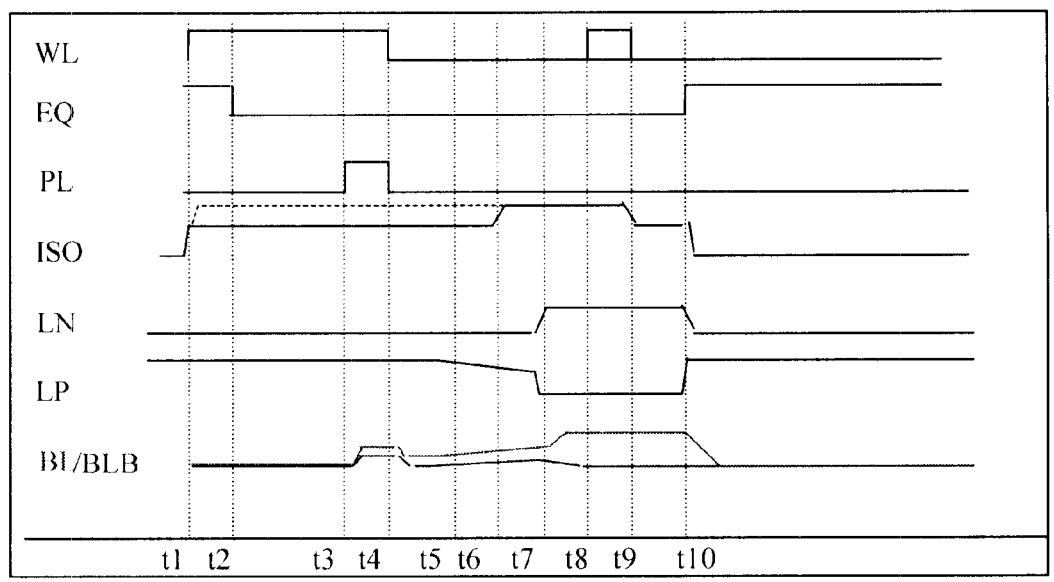
FIG. 3 is a diagram illustrative of the relative timing of various signals in a conventional "read" operation of a ferroelectric memory array.

With reference additionally now to FIG. 3, a diagram illustrative of the relative timing of various signals in a conventional "read" operation of a ferroelectric memory array is shown.

At time t1, the device word line ("WL") goes "high" and the sense amplifier is connected to the bit line while the ISO signal turns "on", or optionally, on "hard". At time t2, the equilibration ("EQ") signal transitions to a logic level "low" allowing the complementary bit ("BL") and bit bar ("BLB") lines to float. At or before time t3 the plate line ("PL") is brought to a logic "high" level and it returns to a logic "low" level at time t4. This represents an "up/down" sensing technique although it is possible to sense with the plate line remaining at a logic "high" level. During this time period, a small signal has developed between the BL and BLB lines and, at time t4, the WL line is also brought "low" to prevent "disturbs" of the "0" signal during sensing.

At time t5, the latch P signal ("LP") turns on relatively slowly. In some conventional applications, multiple P-channel devices may be used to help start the slow sense operation with the small P-channel devices being used to turn "on" large P-channel devices when the signal differential is sufficiently great. At time t6, the isolate ("ISO") signal goes on "hard" and some conventional designs use this technique to allow for faster sensing by isolating the bit lines during the initial portion of the sensing operation. When the ISO signal goes on "hard", the full bit line load is perceived by the sense amplifiers.

At time t7, the latch N signal ("LN") has begun its transition to a logic level "high" although in some conventional designs, LN may be turned "on" with "LP" or is held to be always "on," or is not used in the circuit. As can be seen, the LP signal is now "on hard". At time t8, the BL and BLB lines are now at full CMOS levels and the WL line signal is pulsed to restore the ferroelectric capacitor. At time t9, the WL is "off" again and, at time t10, all nodes are precharged to circuit ground. Alternatively, a precharge level other than ground can be used. It should be noted that the WL line is turned "off" while some signal is still on the bit line pairs and, while not always necessary, is often done to aid retention.

Figure 4:
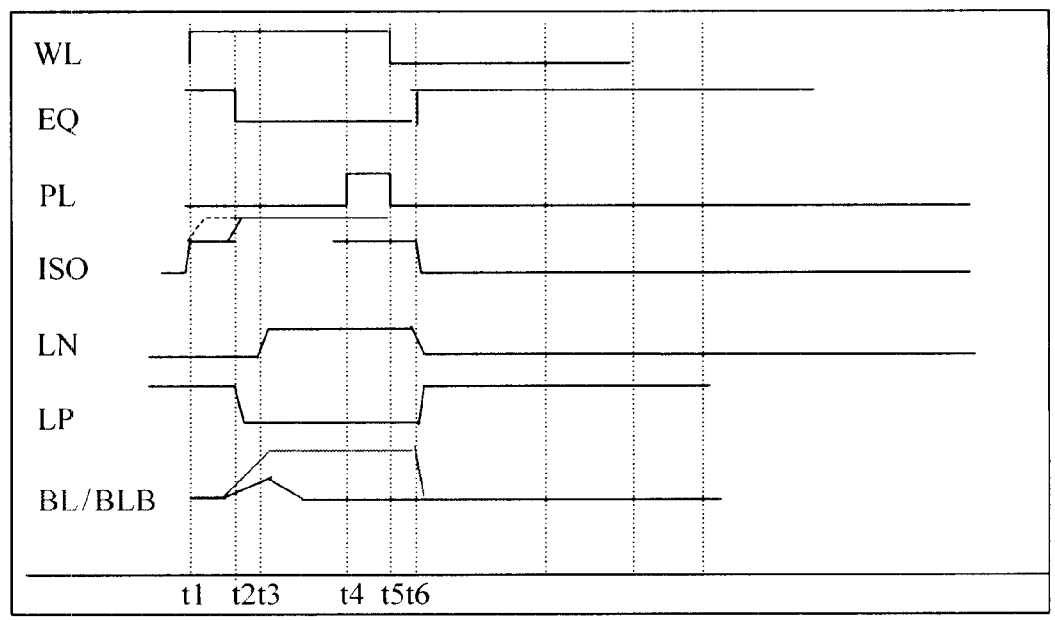
FIG. 4 is a corresponding diagram illustrative of the relative timing of various signals in a non-volatile memory array implementing the capacitance sensing technique of the present invention.

With reference additionally now to FIG. 4, a corresponding diagram illustrative of the relative timing of various signals in a non-volatile memory array implementing the capacitance sensing technique of the present invention is shown.

At time t1, the WL is turned "on" while the ISO signal turns "on", or optionally, on "hard". At time t2, the EQ signal is turned "off" while the ISO signal turns "on hard" and the LP node is also turned "on hard". At time t3, the LN node is turned "on" and while optional, this delay provides the benefit of driving the BL and BLB lines up further prior to clamping the lower signal back "down". At times t4 and t5, the plate line pulses to restore the logic "1" or "0" states of the ferroelectric capacitor and, at time t6, all signals are to precharged back to circuit ground. In operation, data is ready for the device outputs shortly after time t3.

While there have been described above the principles of the present invention in conjunction with specific circuitry, circuit elements and signal timing, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A sensing technique for an integrated circuit device comprising a memory array including a plurality of ferroelectric memory cells coupled to complementary bit lines, the technique comprising:

coupling said complementary bit lines together to a reference voltage level and enabling a word line coupled to at least a portion of said ferroelectric memory cells and coupling said complementary bit lines to a sense amplifier;

uncoupling said complementary bit lines from each other and said reference voltage level and enabling a first enable node of said sense amplifier; and providing data representative of said contents of selected ones of said ferroelectric memory cells at an output of said device without pulsing the plate line.

2. The technique of claim 1 further comprising:

enabling a second opposite enable node of said sense amplifier following said step of enabling said first enable node.

3. The technique of claim 1 further comprising:

more strongly coupling said complementary bit lines to said sense amplifier substantially concurrently with said step of enabling said first enable node.

4. The technique of claim 1 further comprising:

pulsing a plate line coupled to at least a portion of said ferroelectric memory cells following said step of enabling said first enable node of said sense amplifier.

5. The technique of claim 1 further comprising:

disabling said word line, coupling said complementary bit lines together to said reference voltage level and disabling said first enable node.

6. The technique of claim 5 further comprising:

uncoupling said complementary bit lines from said sense amplifier following said step of disabling said word line.

7. A method for sensing the data state stored in a ferroelectric memory cell selectively couplable to a sense amplifier, said method comprising:

coupling said memory cell to said sense amplifier through one of a pair of complementary bit lines initialized to a substantially equal potential;

enabling said sense amplifier; and sensing a capacitive imbalance on said complementary bit lines due to said data state stored in said memory cell without pulsing the plate line.

8. An integrated circuit device including a memory array, said device comprising:

means for initializing at least one pair of complementary bit lines of said memory array to a substantially equal potential;

means for coupling at least one memory cell of said memory array to a corresponding sense amplifier through one of said pair of complementary bit lines;

means for enabling said sense amplifier for sensing a capacitive imbalance between said pair of complementary bit lines due to a data state stored in said memory cell without pulsing the plate line.

9. An integrated circuit device including a memory array comprising at least one pair of complementary bit lines coupled to at least one sense amplifier, said device comprising:

at least one ferroelectric memory cell couplable to one of said complementary bit lines of which both have been initialized to a substantially equal potential, whereupon upon enabling of said sense amplifier a capacitive imbalance between said complementary bit lines may be sensed due to a data state stored in said memory cell without pulsing the plate line.

* * * * *